United States Patent
Limpinsel et al.

(10) Patent No.: US 11,442,090 B2
(45) Date of Patent: Sep. 13, 2022

(54) SYSTEMS AND METHODS FOR MEASURING ELECTRICAL CHARACTERISTICS OF A MATERIAL USING A NON-DESTRUCTIVE MULTI-POINT PROBE

(71) Applicant: UTICA LEASECO, LLC, Rochester Hills, MI (US)

(72) Inventors: Jan Moritz Limpinsel, San Mateo, CA (US); Octavi Santiago Escala Semonin, San Francisco, CA (US); Edwin J. Rodriguez, San Jose, CA (US); Brendan M. Kayes, Los Gatos, CA (US); Vladimir N. Faifer, Santa Clara, CA (US)

(73) Assignee: Utica Leaseco, LLC, Rochester Hills, MI (US)

( * ) Notice: Subject to any disclaimer, the term of this patent is extended or adjusted under 35 U.S.C. 154(b) by 385 days.

(21) Appl. No.: 16/460,432

(22) Filed: Jul. 2, 2019

(65) Prior Publication Data
US 2021/0003628 A1 Jan. 7, 2021

(51) Int. Cl.
*G01R 27/08* (2006.01)
*G01R 1/073* (2006.01)
*G01R 31/26* (2020.01)

(52) U.S. Cl.
CPC .......... *G01R 27/08* (2013.01); *G01R 1/073* (2013.01); *G01R 31/2601* (2013.01); *G01R 31/2648* (2013.01)

(58) Field of Classification Search
CPC ...... G01R 27/08; G01R 27/067; G01R 27/14; G01R 27/205; G01R 1/073; G01R 1/0735;
(Continued)

(56) References Cited

U.S. PATENT DOCUMENTS

| 4,218,650 A | 8/1980 | Nasa |
| 9,746,514 B2 | 8/2017 | Kelly-Morgan et al. |

(Continued)

FOREIGN PATENT DOCUMENTS

| FR | 1333449 A | 7/1963 |
| JP | H0926446 A | 1/1997 |

(Continued)

OTHER PUBLICATIONS

Electro-Tech Systems Ets: "Resistance/Resistivity Probes Series 840," Dec. 1, 2007, Retrieved from the Internet: https://www.mem-gmbh.de/ets-Series%20840.pdf [retrieved on Oct. 5, 2020].

(Continued)

*Primary Examiner* — Amy He
(74) *Attorney, Agent, or Firm* — Arentfox Schiff LLP

(57) ABSTRACT

This disclosure describes an elastic multi-contact probe that includes conductive strips each of which comprises a conductive elastomer; dielectric strips formed on a back surface of a respective conductive strip; and a layer of a thermoplastic formed on back surfaces of the dielectric strips. The disclosure also describes a method that includes measuring a first I-V curve between a pair of inner probes of the an elastic multi-contact probe based on a first current applied to a pair of outer probes; determining a first slope of a linear region of the first I-V curve; measuring a second I-V curve between the pair of inner probes based on a second current applied to the pair of inner probes; determining a second slope of a linear region of the second I-V curve; and calculating a sheet resistance and a contact resistivity of the semiconductor material based on the first and second slopes.

18 Claims, 7 Drawing Sheets

(58) Field of Classification Search
CPC ............ G01R 31/2601; G01R 31/2648; H01R 13/2414; G01N 27/041
See application file for complete search history.

(56) References Cited

U.S. PATENT DOCUMENTS

| | | | |
|---|---|---|---|
| 2007/0241984 A1* | 10/2007 | Schadler | H01Q 1/246 343/820 |
| 2013/0046496 A1 | 2/2013 | Chen | |
| 2014/0303916 A1 | 10/2014 | Mazzeo et al. | |
| 2015/0061714 A1* | 3/2015 | Kelly-Morgan | G01N 27/00 324/754.11 |

FOREIGN PATENT DOCUMENTS

| | | | |
|---|---|---|---|
| WO | WO-2011082180 A2 * | 7/2011 | ......... G01R 31/2891 |
| WO | 2013055082 A1 | 4/2013 | |

OTHER PUBLICATIONS

Zater, et al., "Redesign of a soft conductive rubber strip electrode for measurement of surface resistance according to IEC 60079-32-2, within the context of the PTB Ex Proficiency Testing Scheme," Journal of Electrostatics, vol. 88, 2017, pp. 116-120.

* cited by examiner

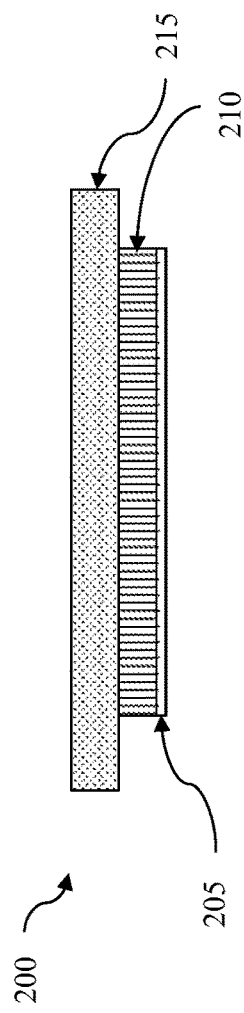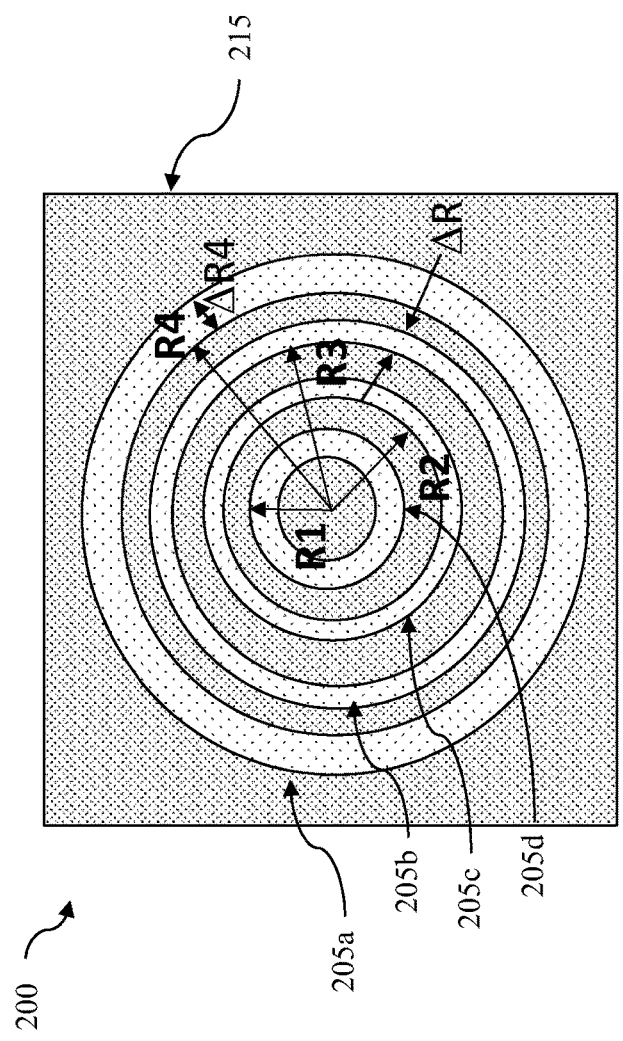
FIG. 2A
FIG. 2B

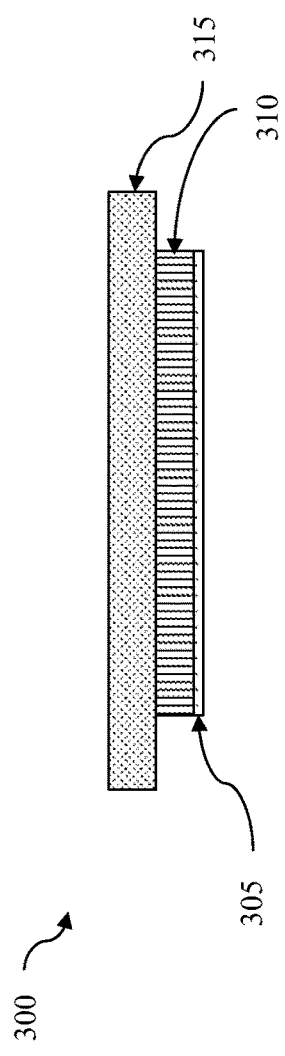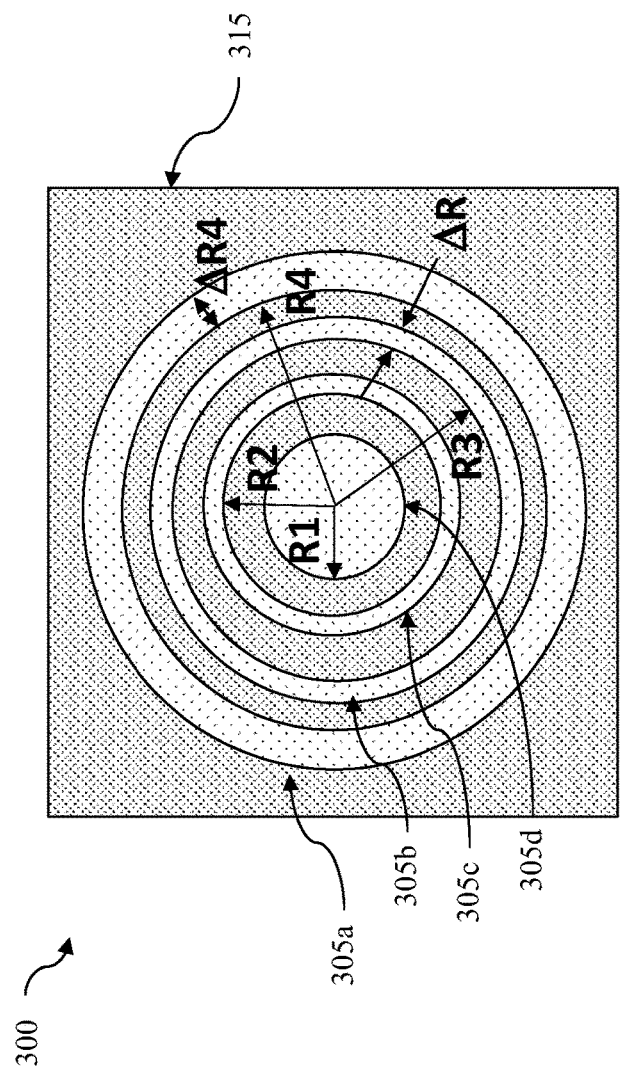

SYSTEMS AND METHODS FOR MEASURING ELECTRICAL CHARACTERISTICS OF A MATERIAL USING A NON-DESTRUCTIVE MULTI-POINT PROBE

TECHNICAL FIELD

This disclosure relates to techniques for measuring electrical characteristics of a material, and more specifically, techniques for measuring electrical characteristics of semiconductor materials using a non-destructive multi-point probe.

BACKGROUND

The purpose of using four-point or 4-point probes ("4PPs") is to measure a resistivity of a material, such as a semiconductor material. For example, 4PPs are used to measure an electrical impedance using separate pairs of current-carrying and voltage-sensing electrodes. In some instances, a 4PP may include four equally spaced probes having metal tips with a finite but very small radius (i.e., the "points" of the probe). During measurements, a high impedance current source is used to supply current through the outer two probes, and a voltmeter measures the voltage that is produced across the inner two probes to determine the sample resistivity. However, standard or conventional 4PPs techniques are generally destructive because they are manufactured using sharp metals, and moreover, standard 4PPs cannot provide accurate measurement if probe/semiconductor contact resistance is too high. Additionally, standard 4PPs techniques are limited to resistivity measurements and cannot be used to gain insight into other characteristics of the semiconductor material.

SUMMARY OF THE DISCLOSURE

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its purpose is to present some concepts of one or more aspects in a simplified form as a prelude to the more detailed description that is presented later.

In an aspect, the present disclosure is directed to an elastic multi-contact probe. The elastic multi-contact probe may include multiple conductive strips each of which comprises a conductive elastomer. The conductive strips may be spaced apart from each other and a front surface of the conductive strips is configured to be placed on a surface of a substrate to be probed. The elastic multi-contact probe may also include multiple dielectric strips. Each of the dielectric strips may be formed on a back surface of a respective one of the conductive strips. The elastic multi-contact probe may further include a single layer of a thermoplastic formed on back surfaces of the dielectric strips such that the dielectric strips separate the conductive strips from the single layer of the thermoplastic.

In another aspect, the present disclosure is directed to a method for performing a measurement of a surface area of a semiconductor material. The method may include measuring a first current-voltage (I-V) curve between a pair of inner probes of multiple probes of an elastic multi-contact probe based on a first current applied to a pair of outer probes of the probes. The method may also include determining a first slope of a linear region of the first I-V curve. The method may further include measuring a second I-V curve between the pair of inner probes based on a second current applied to the pair of inner probes. The method may also include determining a second slope of a linear region of the second I-V curve. The method may also include calculating a sheet resistance and a contact resistivity of the semiconductor material based on the first slope and the second slope.

In another aspect, the elastic multi-contact probe, or variations thereof, may be used to perform measurements on the surface area of a semiconductor material to obtain or calculate a sheet resistance, a contact resistivity, or both, of the semiconductor material.

BRIEF DESCRIPTION OF THE DRAWINGS

The novel features believed to be characteristic of aspects of the disclosure are set forth in the appended claims, but supported by both the description that follows and the appended figures. In the description that follows, like parts are marked throughout the specification and drawings with the same or similar numerals, respectively. The various figures are not necessarily drawn to scale and certain figures may be shown in exaggerated or generalized form in the interest of clarity and conciseness. The disclosure itself, as well as further objects and advances thereof, will be best understood by reference to the following detailed description of illustrative aspects of the disclosure when read in conjunction with the accompanying figures, wherein:

FIGS. 2A and 2B illustrate a side view and a bottom view, respectively, of another example of an elastic multi-contact probe in accordance with aspects of the present disclosure;

FIGS. 3A and 3B illustrate a side view and a bottom view, respectively, of another example of an elastic multi-contact probe in accordance with aspects of the present disclosure;

DETAILED DESCRIPTION

This disclosure describes various structures, devices, and arrangements that address and solve various of the problems with standard or conventional 4PPs. For example, the disclosure describes an elastic multi-contact probe that makes gentle contact to a material, such as a semiconductor material, using large-area electrodes that are formed by using, for example, a conductive elastomer. In this way, accurate and non-destructive measurements of the sheet resistance can be taken even for very high contact resistance.

Figure 1A:
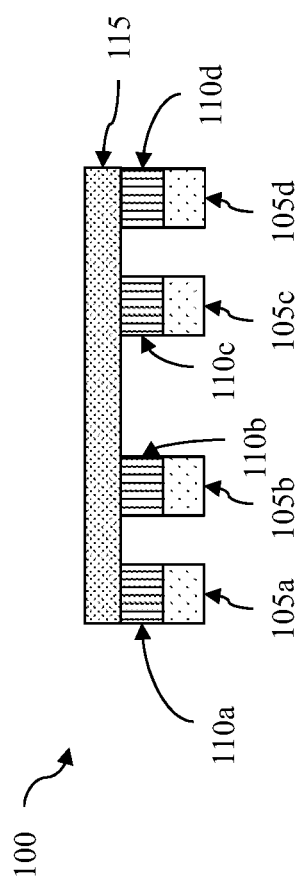
FIGS. 1A and 1B illustrate a side view and a bottom view, respectively, of an example of an elastic multi-contact probe in accordance with aspects of the present disclosure.
Figure 1B:
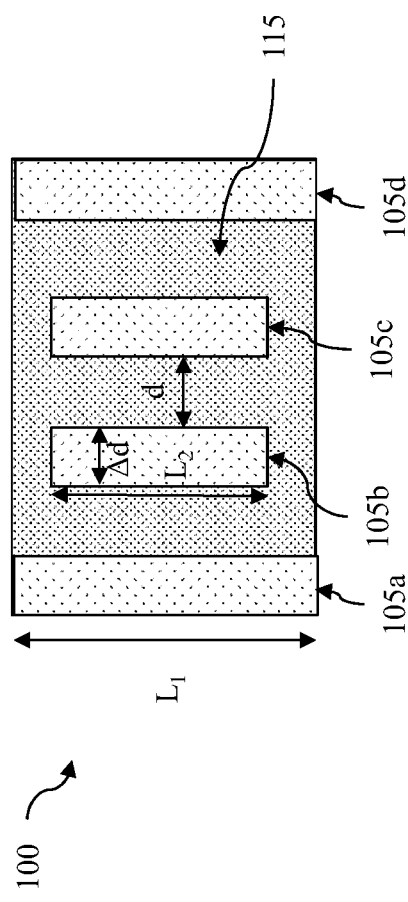

FIGS. 1A and 1B illustrate a side view and a bottom view, respectively, of an example of an elastic multi-contact probe in accordance with aspects of the present disclosure. For example, an elastic multi-contact probe 100 is shown having multiple contacts extending from the probe. In this example, four (4) contacts are shown. In some implementations, the contacts may include conductive strips 105a-105d, collectively referred to as conductive strips 105, formed using an electrically conductive elastomer, e.g., a conductive rubber. The use of a conductive elastomer provides for increased elasticity, such that under uniform compression, connectivity to a surface of semiconductor material is improved to achieve better measurements. In some implementations, the conductive strips 105 may be spaced apart from each other and may have a front surface that may be placed on a surface of a substrate to be probed. That is, the elastic multi-contact probe 100 may be configured such that when the elastic multi-contact probe 100 is applied to a material, a front surface of each conductive strips 105 may be in electrical contact with the surface of the substrate to be probed. In some implementations, an outer pair of the conductive strips 105a, 105d may be configured to establish a current flow through a material being tested, and an inner pair of the conductive strips 105b, 105c may be configured to measure a voltage and/or a current developed across a portion of the material being tested. In some implementations, the elastic multi-contact probe 100 may be coupled to external testing equipment (not shown) for determining an electrical property of the material, such as the sheet resistance of the material, from the measurements made by using the probe. For example, the external testing equipment may be utilized to inject and measure a current flowing into the material using the outer pair of the conductive strips 105a, 105d and to measure a voltage and/or a current across a portion the material between the inner pair of the conductive strips 105b, 105c. In some implementations, the outer pair of conductive strips 105a, 105d may be linear conductive strips of material having a length L1 and the inner pair of conductive strips 105b, 105c may be linear conductive strips of material having a length L2 that is shorter than the length L1. In some implementations, each of the conductive strips 105 may have a width $\Delta d$ and may be separated by a distance d. In some implementations, the sheet resistance and contact resistivity may be based on the width $\Delta d$, the distance d, the length L1, and the length L2. In a non-limiting example, the width $\Delta d$=5 millimeters (mm), the distanced d=5 mm, the length L1=30 mm, and the length L2=15 mm. The conductive strips 105 in the elastic multi-contact probe 100 may be parallel to each other.

As further shown in FIGS. 1A and 1B, the contacts extending from the elastic multi-contact probe 100 may also include multiple dielectric strips 110a-110d, collectively referred to as dielectric strips 110, formed on a respective back surface of the conductive strips 105. In some implementations, the dielectric strips 110 provide for increased elasticity and compression to provide improved uniform contact to the substrate. As such, the dielectric strips 110a, 110d may likewise have a length L1 and the dielectric strips 110b, 110c may likewise have a length L2 that is shorter than the length L1. Like the conductive strips 105, each of the dielectric strips 110 may have a width $\Delta d$ and may be separated by a distance d. The dielectric strips 110 may be formed using, for example, a dielectric rubber. Thus, as shown in FIGS. 1A and 1, the multi-contact probe 100 may include four (4) contacts, with conductive strip 105a and dielectric strip 110a forming a first contact, conductive strip 105b and dielectric strip 110b forming a second contact, conductive strip 105c and dielectric strip 110c forming a third contact, and conductive strip 105d and dielectric strip 110d forming a fourth contact.

The elastic multi-contact probe 100 may also include a layer of dielectric thermoplastic 115 formed on the back surfaces of the dielectric strips 110. For example, in some implementations, the layer of thermoplastic 115 may be a single layer of a thermoplastic formed on back surfaces of the dielectric strips 110, such that the dielectric strips 110 separate the conductive strips 105 from the single layer of the thermoplastic 115. In some implementations, the thermoplastic 115 may be, for example, a polyoxymethylene (POM). The layer of thermoplastic 115 may be a single structure with an area that extends such that the contacts of the elastic multi-contact probe 100 may be configured or arranged as described in FIGS. 1A and 1B.

FIGS. 2A and 2B illustrate a side view and a bottom view, respectively, of another example elastic multi-contact probe in accordance with aspects of the present disclosure. For example, FIGS. 2A and 2B illustrate an elastic multi-contact probe 200 having multiple contacts. In this example, there are four (4) circular or ring contacts shown. In some implementations, the contacts may include conductive strips 205a-205d, collectively referred to as conductive strips 205, formed using an electrically conductive elastomer, e.g., a conductive rubber. The use of a conductive elastomer provides for increased elasticity, such that under uniform compression, connectivity to a surface of semiconductor material is improved to achieve better measurements. In some implementations, the conductive strips 205 may be spaced apart from each other and may have a front surface that may be placed on a surface of a substrate to be probed. That is, the elastic multi-contact probe 200 may be configured such that when the elastic multi-contact probe 200 is applied to a material, the front surface of each conductive strips 205 may be in electrical contact with the surface of the substrate to be probed. In some implementations, an outer pair of the conductive strips 205a, 205d (e.g., the inner most strip 205d and the outer most strip 205a) may be configured to establish a current flow through a material being tested, and an inner pair of the conductive strips 205b, 205c (e.g., the middle strips 205b, 205c between the inner most strip 205d and the outer most strip 205a) may be configured to measure a voltage and/or a current developed across a portion of the material being tested. In some implementations, the elastic multi-contact probe 200 may be coupled to external testing equipment (not shown) for determining an electrical property of the material, such as the sheet resistance of the material, from the measurements made by using the probe. For example, the external testing equipment may be utilized to inject and measure a current flowing into the material using the outer pair of the conductive strips 205a, 205d and to measure a voltage and/or a current across a portion the material between the inner pair of the conductive strips 205b, 205c.

In some implementations, the conductive strips 205 may be concentric rings of different radii and with a center of the rings being at a center of the elastic multi-contact probe 200. That is, the conductive strips 205 may include multiple ring conductive strips with each of the ring conductive strips having a different radius and being concentric with a center of the elastic multi-contact probe 200. For example, as illustrated in FIGS. 2A and 2B, the conductive strip 205a may have a respective inner radius R4, the conductive strip 205b may have a respective inner radius R3, the conductive strip 205c may have a respective inner radius R2, and the conductive strip 205d may have a respective outer radius R1. In some implementations, each of the conductive strips 205 may have a width $\Delta R$, with the width $\Delta R$ being a difference between the outer and inner radii of the conductive strip 205.

In some implementations, the width ΔR for the conductive strips 205 may be the same for each of the conductive strips 205, different for each of the conductive strips 205, or the same for some of the conductive strips 205, with at least one conductive strip 205 having a different width ΔR. For example, the width ΔR for the conductive strips 205b and 205c may be a first width ΔR and the width ΔR for the conductive strips 205a and 205d may be a second width ΔR that is different than the first width ΔR.

In a non-limiting example of the elastic multi-contact probe 200, R1=4 mm, R2=6 mm, R3=15.5 mm, R4=19 mm, for conductive strip 205c ΔR=1.5 mm, for conductive strip 205b ΔR=1.5 mm, and for conductive strip 205a ΔR=3.0 mm. For conductive strip 205d, the width ΔR may be similar to that for conductive strip 205a, ΔR=3.0 mm. Using these and similar dimension may be selected to improve accuracy of determination of the sheet resistance, $R_{SH}$. For example by using ΔR<<R2, R3 as small as possible, an approximation of the sheet resistance can be made such that the solutions to equations (7)-(10) below are more accurate.

As further shown in FIGS. 2A and 2B, the multiple contacts may also include strips of dielectric material 210a-210d, collectively referred to as dielectric strips 210, formed on a respective back surface of the conductive strips 205. As such, the dielectric strips 210 have a radius corresponding to the radius of the respective conductive strip 205. That is, the dielectric strips 210 may each have a same radius as the respective ring conductive strip 205. Like the conductive strips 205, each of the dielectric strips 210 may have a width ΔR that matches that of the respective conductive strip 205. The dielectric strips 210 may be formed using, for example, a dielectric rubber. Thus, as shown in FIGS. 2A and 2B, the multi-contact probe 200 may include four (4) contacts, with conductive strip 205a and dielectric strip 210a forming a first contact, conductive strip 205b and dielectric strip 210b forming a second contact, conductive strip 205c and dielectric strip 210c forming a third contact, and conductive strip 205d and dielectric strip 210d forming a fourth contact.

The elastic multi-contact probe 200 may also include a layer of thermoplastic 215 formed on the back surfaces of the dielectric strips 210. For example, in some implementations, the layer of thermoplastic 215 may be a single layer of a thermoplastic formed on back surfaces of the dielectric strips 210, such that the dielectric strips 210 separate the plurality of conductive strips 205 from the single layer of the thermoplastic 215. For example, the thermoplastic 215 may be a polyoxymethylene (POM). The layer of thermoplastic 215 may be a single structure with an area that extends such that the contacts of the elastic multi-contact probe 200 may be configured or arranged as described in FIGS. 2A and 2B.

FIGS. 3A and 3B illustrate a side view and a bottom view, respectively, of another example elastic multi-contact probe in accordance with aspects of the present disclosure. For example, FIGS. 3A and 3B illustrate an elastic multi-contact probe 300 that is substantially similar to the elastic multi-contact probe 200 in FIGS. 2A and 2B, and as such, only differences between the elastic multi-contact probe 300 and the elastic multi-contact probe 200 are discussed herein. Namely, as shown in FIGS. 3A and 3B, the elastic multi-contact probe 300 includes multiple conductive strips 305a-305d, with the conductive strip 305a being a solid conductive circle concentric with a center of the elastic multi-contact probe 300 and the conductive strips 305b-305d being ring conductive strips having a different radius and being concentric with the center of the elastic multi-contact probe 300.

In a non-limiting example of the elastic multi-contact probe 300, R2=6 mm, R3=15.5 mm, R4=19 mm, for conductive strip 305c ΔR=1.5 mm, for conductive strip 305b ΔR=1.5 mm, and for conductive strip 305a ΔR=3.0 mm. The conductive strip 305d is a solid disk with outer radius R1=4 mm.

Figure 4:
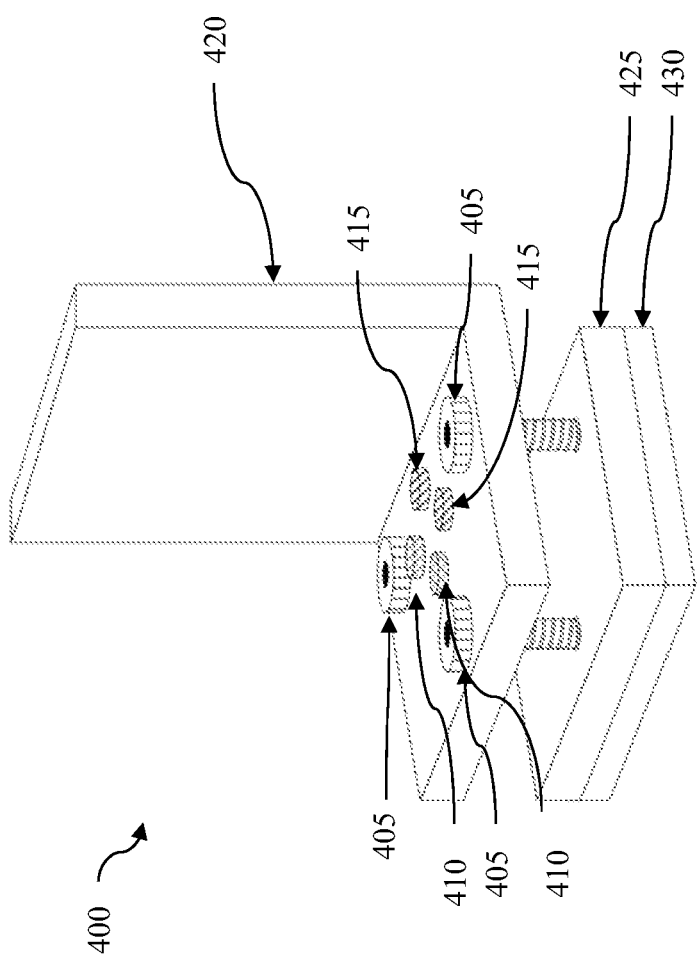
FIG. 4 illustrates an isometric view of an example of an elastic multi-contact probe in accordance with aspects of the present disclosure.

FIG. 4 illustrates an example self-aligning applicator in accordance with aspects of the present disclosure. The self-aligning applicator may use with one of the elastic multi-contact probes 100, 200, and 300 to make measurements on the surface of a substrate. For example, a self-aligning applicator 400 includes multiple adjustable springs 405. In some implementations, the springs 405 may include banana springs, although it should be understood by those of ordinary skill in the art that other types of springs may be used in accordance with aspects of the present disclosure. In some implementations the springs 405 may include three (3) springs, although it should be understood by those of ordinary skill in the art that any number of springs may be used in accordance with aspects of the present disclosure. In some implementations, the self-aligning applicator 400 may include an L-shaped layer of material 420 to allow for positioning of the self-aligning applicator 400. It should be understood by those of ordinary skill in the art, however, that other shaped layers may be used in accordance with aspects of the present disclosure. The L-shaped layer of material 420 may be metallic or a thermoplastic, such as a polyoxymethylene (POM). In some implementations, the springs 405 are applied to a back surface of another layer of thermoplastic 425 placed on the backside of an elastic multi-contact probe 430, such as the elastic multi-contact probe 100 of FIGS. 1A and 1, the elastic multi-contact probe 200 of FIGS. 2A and 2B, or the elastic multi-contact probe 300 of FIGS. 3A and 3B. For example, the thermoplastic 425 may be a polyoxymethylene (POM). In some implementations, the self-aligning applicator 400 may be used to adjust a placement of the elastic multi-contact probe 430 to the surface area of the semiconductor material. For example, the springs 405 may be used to adjust the placement of the elastic multi-contact probe 430.

The self-aligning applicator 400 may also include one or more positive terminals 410 and one or more negative terminals 415 for connecting the self-aligning applicator 400 to an external device, such as a voltmeter, for testing. The positive terminals 410 and the negative terminals 415 are also connected to the various contacts in the elastic multi-contact probe 430 such that signals, e.g., voltages and/or currents, may be provided to or received from the elastic multi-contact probe 430 through the self-aligning applicator 400. For example, when the elastic multi-contact probe 430 is the elastic multi-contact probe 300, the terminals 410 may be banana connectors that are connected to the outer conductive strips 305d and 305a to apply current from a current source and the terminals 415 may be banana connectors that are connected to inner conductive strips 305b and 305c and to voltage meter. A similar connection of the terminals 410 and 415 may be used when the elastic multi-contact probe 430 is the elastic multi-contact probe 100 or the elastic multi-contact probe 200, for example.

Figure 5:
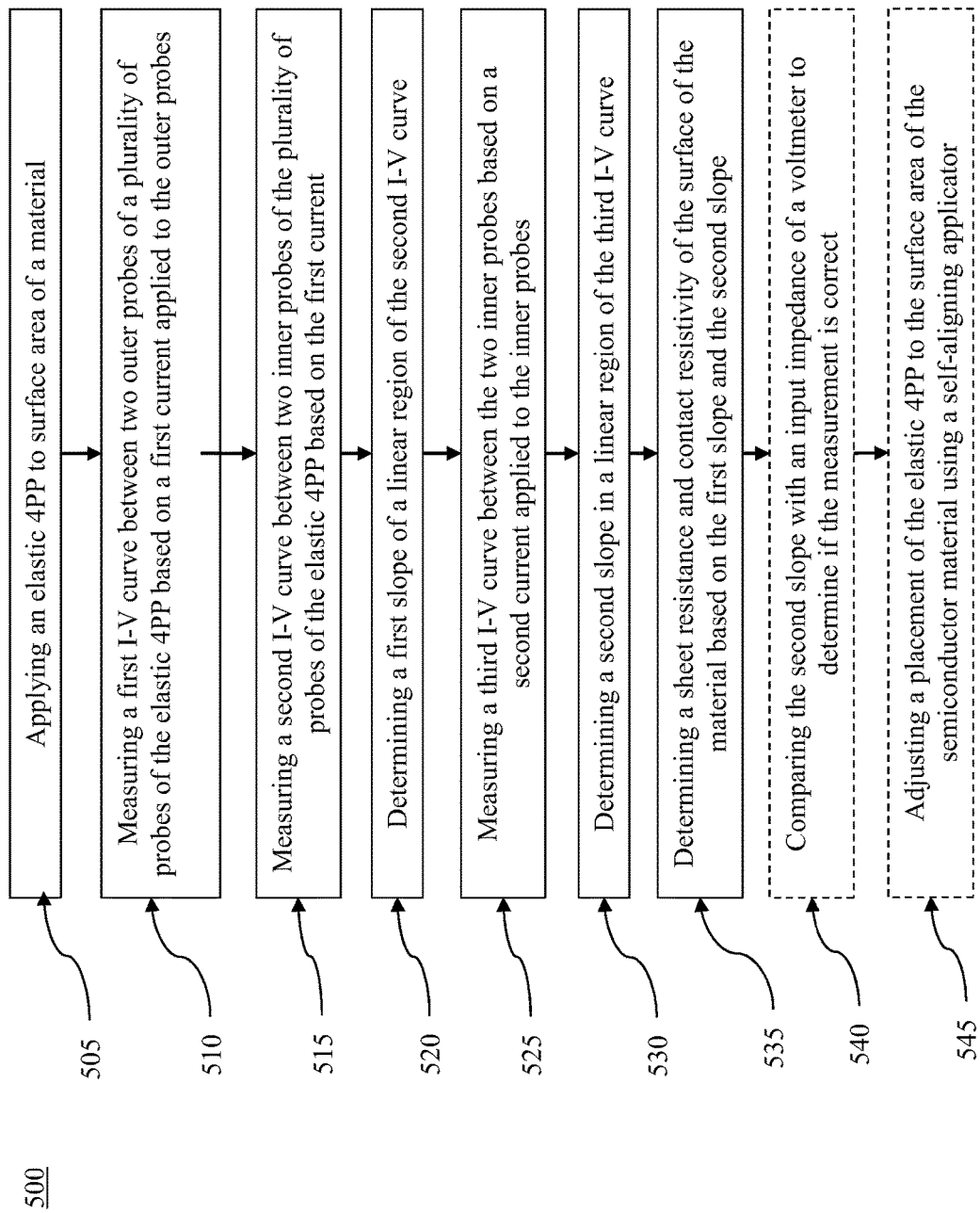
FIG. 5 illustrates an method for measuring a sheet resistance and contact resistivity using an elastic multi-contact probe in accordance with aspects of the present disclosure.

FIG. 5 illustrates a method for measuring a sheet resistance and contact resistivity using an elastic multi-contact probe such as the ones described above in FIGS. 1A-3B. Namely, the method 500 includes applying an elastic multi-contact probe to surface area of, for example, a semiconductor wafer or film at 505.

The method 500 may also include measuring a first current-voltage (I-V) curve, i.e., a first I-V curve, V2W1,4

(J1,4), between two outer probes of the elastic multi-contact probe, e.g., the conductive strips 105a, 105d of FIGS. 1A and 1, the conductive strips 205a, 205d of FIGS. 2A and 2B, or the conductive strips 305a, 305d of FIGS. 3A and 3B, to determine a control contact resistance and a breakdown voltage at 510. In some implementations, the first I-V curve may be based on a first current applied to the two outer probes of the elastic multi-contact probe.

The method 500 may also include measuring a second I-V curve, V4W2,3(J1,4), between two inner probes of the elastic multi-contact probe, e.g., the conductive strips 105b, 105c of FIGS. 1A and 1B, the conductive strips 205b, 205c of FIGS. 2A and 2B, or the conductive strips 305b, 305c of FIGS. 3A and 3B, based on the first current applied to the two outer probes at 515 and determining a first slope dV4W2,3/dJ1,4 of a linear region of the second I-V curve at 520.

In some implementations, the method 500 may also include measuring a third I-V curve, V2W2,3(J2,3), between the two inner probes based on a second current applied to the two inner probes at 525 and determining a second slope dV2W2,3/dJ2,3 in a linear region of the third I-V curve at 530.

The method 500 may also include determining a sheet resistance ($R_{SH}$) and a contact resistivity ($\rho C$) based on the first slope and the second slope at 535.

For example, for a multi-point probe having linear contacts, such as the contacts having the linear conductive strips 105 and dielectric strips 110 of FIGS. 1A and 1B, in the case of an infinitely high contact resistance, e.g., $\alpha \Delta d \ll 1$, the sheet resistance may be determined in accordance with equation (1):

$$Rsh = \frac{LV_{4W}}{J(d + \Delta d)}. \quad (1)$$

In another example, for the multi-point probe having linear contacts, in the case of infinitely low contact resistance, e.g., $\alpha \Delta d \gg 1$, the sheet resistance may be determined in accordance with equation (2):

$$Rsh = \frac{LV_{4W}}{Jd}. \quad (2)$$

In yet another example, for the multi-point probe having linear contacts, in the case of an intermediate contact resistance, the sheet resistance, $R_{SH}$, and the contact resistivity, $\rho C$, may be based on equations (3) and (4) below:

$$\frac{dV_{4W2,3}}{dJ_{1,4}} = \frac{R_{SH}d}{L} + \frac{2\sqrt{R_{SH}\rho_C}\{\cosh(\alpha \Delta d) - 1\}}{L\sinh(\alpha \Delta d)} \quad (3)$$

$$\frac{dV_{2W2,3}}{dJ_{2,3}} = \frac{R_{SH}d}{L} + 2\frac{\sqrt{R_{SH}\rho_C}\cosh(\alpha \Delta d)}{L\sinh(\alpha \Delta d)}, \quad (4)$$

where $\alpha = \sqrt{\frac{R_{SH}}{\rho_C}}$.

For example, for a multi-point probe having ring-shaped contacts, such as the contacts having the conductive strips 205 and dielectric strips 210 of FIGS. 2A and 2B or the conductive strips 305 and dielectric strips 310 of FIGS. 3A and 3B, in the case of an infinitely high contact resistance, e.g., $\alpha \Delta R \ll 1$, the sheet resistance may be determined in accordance with equation (5):

$$Rsh = \frac{2\pi V_{4W}}{J\ln\left(\frac{R_3}{R_2 + \Delta R}\right)}. \quad (5)$$

In another example, for the multi-point probe having ring-shaped contacts, in the case of infinitely low contact resistance, e.g., $\alpha \Delta R \gg 1$, the sheet resistance may be determined in accordance with equation (6):

$$Rsh = \frac{2\pi V_{4W}}{J\ln\left(\frac{R_3 + \Delta R/2}{R_2 + \Delta R/2}\right)}. \quad (6)$$

In yet another example, for the multi-point probe having ring-shaped contacts, in the case of an intermediate contact resistance, the sheet resistance, $R_{SH}$, and the contact resistivity, $\rho C$, may be based on equations (7) and (8) below:

$$\frac{dV_{4W2,3}}{dJ_{1,4}} = \\ \frac{R_{SH}}{2\pi}\ln\left(\frac{R_3}{R_2 + \Delta R}\right) + \frac{\sqrt{R_{SH}\rho_C}(R_2 + R_3 + \Delta R)\{\cosh(\alpha \Delta R) - 1\}}{2\pi(R_2 + \Delta R)R_3\sinh(\alpha \Delta R)} \quad (7)$$

$$\frac{dV_{2W2,3}}{dJ_{2,3}} = \frac{R_{SH}}{2\pi}\ln\left(\frac{R_3}{R_2 + \Delta R}\right) + \frac{\sqrt{R_{SH}\rho_C}(R_2 + R_3 + \Delta R)\cosh(\alpha \Delta R)}{2\pi(R_2 + \Delta R)R_3\sinh(\alpha \Delta R)} \quad (8)$$

In yet another example, for the multi-point probe having ring-shaped contacts, in the case of an intermediate contact resistance, the sheet resistance $R_{SH}$ and the contact resistivity $\rho_C$ may be based on equations (9) and (10) below:

$$\frac{dV_{4W2,3}}{dJ_{1,4}} = \\ \frac{R_{SH}}{2\pi}\ln\left(\frac{R_3}{R_2 + \Delta R}\right) + \frac{\sqrt{R_{SH}\rho_C}(R_2 + R_3 + \Delta R)\{\cosh(\alpha \Delta R) - 1\}}{2\pi(R_2 + \Delta R)R_3\sinh(\alpha \Delta R)} \quad (9)$$

$$\frac{dV_{2W1,4}}{dJ_{1,4}} = \frac{R_{SH}}{2\pi}\ln\left(\frac{R_4}{R_1 + \Delta R}\right) + \frac{\sqrt{R_{SH}\rho_C}(R_1 + R_4 + \Delta R)\cosh(\alpha \Delta R)}{2\pi(R_1 + \Delta R)R_3\sinh(\alpha \Delta R)}. \quad (10)$$

The method 500 may optionally include comparing an impedance corresponding to the second slope with an input impedance of a measurement device, such as a voltmeter, to determine if second slope is accurate at 540. For example, in some implementations, if the input impedance of the measurement device is substantially greater than the second slope, then the second slope is accurate.

The method 500 may optionally include adjusting a placement of the elastic multi-contact probe to the surface area of the semiconductor material using a self-aligning applicator at 545.

Figure 6:
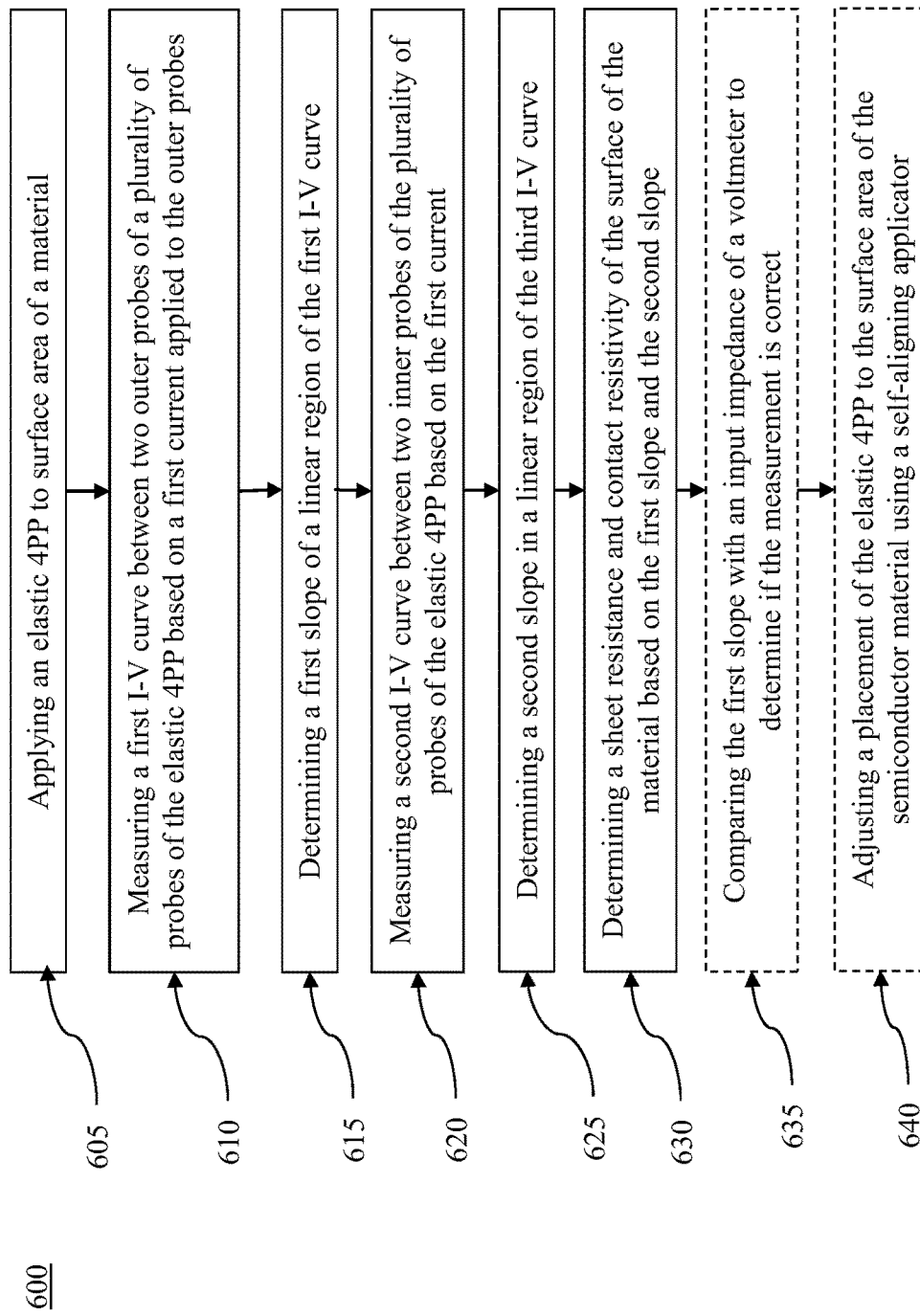
FIG. 6 illustrates another method for measuring a sheet resistance and contact resistivity using an elastic multi-contact probe in accordance with aspects of the present disclosure.

FIG. 6 illustrates another method for measuring a sheet resistance and contact resistivity using an elastic multi-contact probe such as the ones described above in FIGS. 1A-3B. Namely, the method 600 includes applying an elastic multi-contact probe to surface area of, for example, a semiconductor wafer or film at 605.

The method 600 may also include measuring a first current-voltage curve, i.e., an I-V curve, $V_{2W1,4}(J_{1,4})$, between two outer probes of the elastic multi-contact probe, e.g., the conductive strips 105a, 105d of FIGS. 1A and 1B, the conductive strips 205a, 205d of FIGS. 2A and 2B, or the conductive strips 305a, 305d of FIGS. 3A and 3B, to determine a control contact resistance and a breakdown voltage at 610 and determining a first slope $dV_{2W1,4}/dJ_{1,4}$ of a linear region of the first I-V curve at 615. In some implementations, the first I-V curve may be based on a first current applied to the two outer probes of the elastic multi-contact probe.

The method 600 mays also include measuring a second I-V curve, $V_{4W2,3}(J_{1,4})$, between two inner probes of the elastic multi-contact probe, e.g., the conductive strips 105b, 105c of FIGS. 1A and 1B, the conductive strips 205b, 205c of FIGS. 2A and 2B, or the conductive strips 305b, 305c of FIGS. 3A and 3B, based on the first current applied to the two outer probes at 620 and determining a second slope $dV_{4W2,3}/dJ_{114}$ of a linear region of the second I-V curve at 625. As described above with respect to FIG. 5, the method 600 may also include determining a sheet resistance, $R_{SH}$, and a contact resistivity, $\rho C$, based on the first slope and the second slope at 630.

The method 600 may optionally include comparing an impedance corresponding to the second slope with an input impedance of a measurement device, such as a voltmeter, to determine if second slope is correct at 635. For example, in some implementations, if the input impedance of the measurement device is substantially greater than the second slope, then the second slope is accurate.

The method 600 may optionally include adjusting a placement of the elastic multi-contact probe to the surface area of the semiconductor material using a self-aligning applicator at 640.

Figure 7:
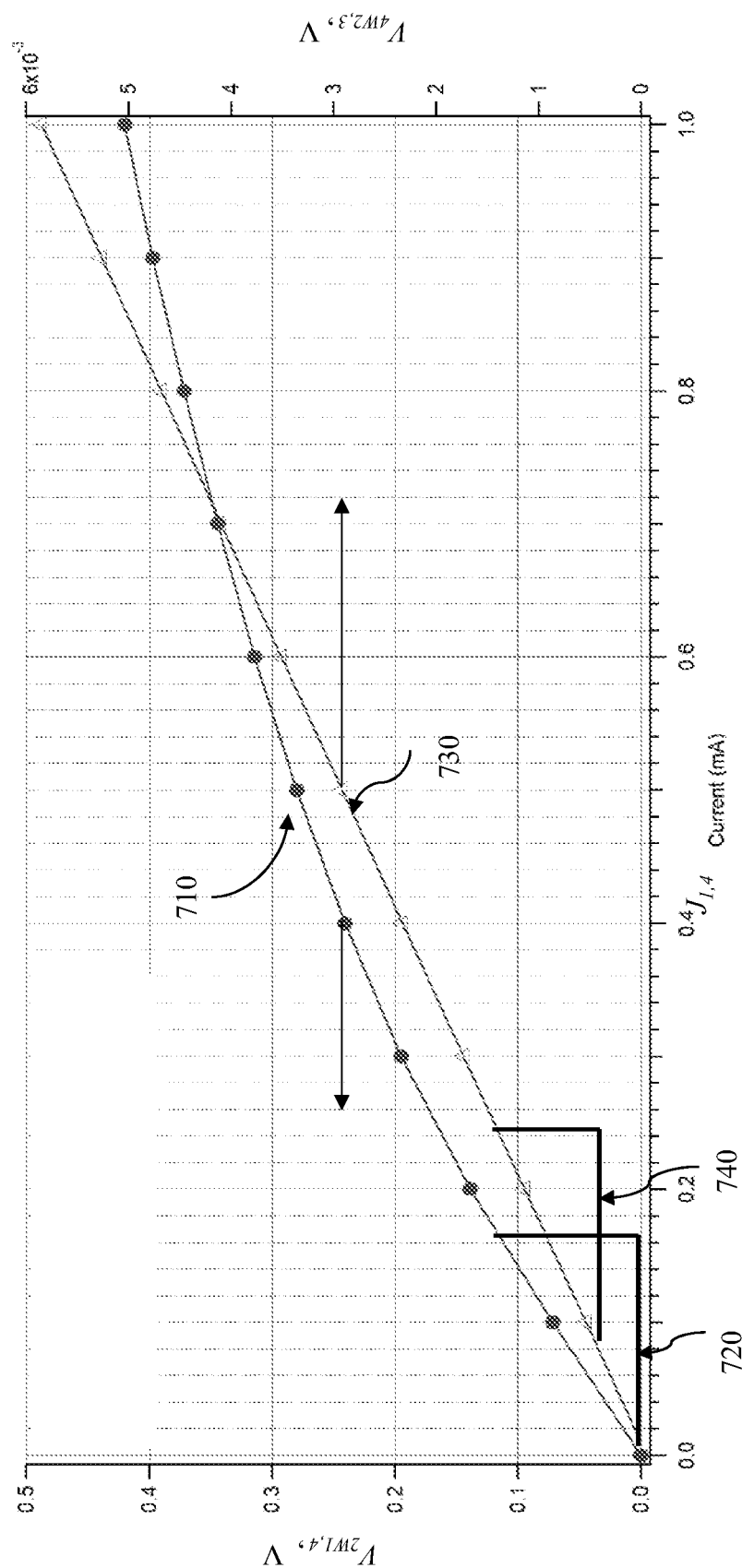
FIG. 7 demonstrates a graphical representation of the measurements taken using the method of FIG. 6 in accordance with aspects of the present disclosure.

FIG. 7 demonstrates a graphical representation of the measurements taken using, for example, the method 600. Namely, FIG. 7 illustrates measurements of a sheet resistance and a contact resistivity of a contact or surface layer of GaAlAs solar cell using the elastic multi-contact probe 300 depicted in FIGS. 3A and 3B. It is to be understood by those of ordinary skill in the art that a similar approach may be used for other types of layers in other types of solar cells, including Si-based solar cells and/or compound semiconductor-based solar cells.

As illustrated in FIG. 7, a first I-V curve 710 may be measured between two outer probes of the elastic multi-contact probe (FIG. 6 at 610) and a first slope 720 may be determined based on the first I-V curve 710 (FIG. 6 at 615). Additionally, a second I-V curve 730 may be measured between two inner probes of the elastic multi-contact probe (FIG. 6 at 620) and a second slope 740 may be determined based on the second I-V curve 730 (FIG. 6 at 625). Using these values, a sheet resistance, $R_{SH}$, and a contact resistivity, $\rho C$, of a contact or surface layer of the GaAlAs solar cell may calculated as described herein (FIG. 6 at 630). In this example, the sheet resistance and the contact resistivity of the contact layer of GaAlAs solar cell are determined based on the techniques described above to be $R_{SH}$=41.1 Ohm/sq and $\rho C$=660 Ohm*cm², respectively.

As used in this disclosure and the appended claims, the terms "plurality" and "multiple" may be used interchangeably to refer to more than one of a particular structure, layer, device, element, or component.

The above description of various embodiments of the claimed subject matter has been provided for the purposes of illustration and description. It is not intended to be exhaustive or to limit the claimed subject matter to the precise forms disclosed. Many modifications and variations will be apparent to one skilled in the art. Implementations were chosen and described in order to best describe certain principles and practical applications, thereby enabling others skilled in the relevant art to understand the subject matter, the various implementations, and the various modifications that are suited to the particular uses contemplated. It is therefore intended that the scope of the techniques described herein be limited not by this Detailed Description, but rather by any claims that issue on an application based hereon. Accordingly, the disclosure of various implementations is intended to be illustrative, but not limiting, of the scope of the embodiments, which is set forth in the following claims.

What is claimed is:

1. An elastic multi-contact probe comprising:
   a plurality of conductive strips each of which comprises a conductive elastomer, the plurality of conductive strips being spaced apart from each other, and a front surface of the conductive strips being configured to be placed on a surface of a substrate to be probed;
   a plurality of dielectric strips, each of the plurality of dielectric strips being formed directly on a back surface of a respective one of the plurality of conductive strips, and wherein each of the plurality of dielectric strips mirror a shape of the respective one of the plurality of conductive strips; and
   a single layer of a thermoplastic formed on back surfaces of the dielectric strips such that the dielectric strips separate the plurality of conductive strips from the single layer of the thermoplastic.

2. The elastic multi-contact probe of claim 1, wherein the plurality of conductive strips comprises a plurality of linear conductive strips parallel to each other.

3. The elastic multi-contact probe of claim 2, wherein the plurality of linear conductive strips includes:
   a pair of outer conductive strips having a first length, and
   a pair of inner conductive strips having a second length that is shorter than the first length.

4. The elastic multi-contact probe of claim 3, wherein the plurality of dielectric strips comprises a plurality of linear dielectric strips having a same length as the respective conductive strip.

5. The elastic multi-contact probe of claim 4, wherein the plurality of linear dielectric strips includes:
   a pair of outer linear dielectric strips having the first length, and
   a pair of inner linear dielectric strips having the second length.

6. The elastic multi-contact probe of claim 4, wherein each of the linear dielectric strips has a same width as the respective linear conductive strip.

7. The elastic multi-contact probe of claim 1, wherein the plurality of conductive strips comprises a plurality of ring conductive strips, each of the ring conductive strips having a different radius and being concentric with a center of the elastic multi-contact probe.

8. The elastic multi-contact probe of claim 7, wherein the plurality of ring conductive strips comprises:
   a first ring conductive strip having a first radius,
   a second ring conductive strip having a second radius that is larger than the first radius,
   a third ring conductive strip having a third radius that is larger than the second radius, and
   a fourth ring conductive strip having a fourth radius that is larger than the third radius.

9. The elastic multi-contact probe of claim 8, wherein the plurality of dielectric strips comprises a plurality of ring dielectric strips, each of the ring dielectric strips having a same radius as the respective ring conductive strip.

10. The elastic multi-contact probe of claim 9, wherein each of the ring dielectric strips has a same width as the respective ring conductive strip.

11. The elastic multi-contact probe of claim 1, wherein the plurality of conductive strips comprises a solid conductive circle concentric with a center of the elastic multi-contact probe and a plurality of ring conductive strips, each of the ring conductive strips having a different radius and being concentric with the center of the elastic multi-contact probe.

12. The elastic multi-contact probe of claim 11, wherein:
the solid conductive circle has a first radius, and
the plurality of ring conductive strips comprises:
   a first ring conductive strip having a second radius that is larger than the first radius,
   a second ring conductive strip ring having a third radius that is larger than the second radius, and
   a third ring conductive strip having a fourth radius that is larger than the third radius.

13. The elastic multi-contact probe of claim 12, wherein the plurality of dielectric strips comprises a solid dielectric circle having a same radius as the solid conductive circle and a plurality of ring dielectric strips, each of the ring dielectric strips having a same radius as the respective ring conductive strip.

14. The elastic multi-contact probe of claim 13, wherein each of the ring dielectric strips has a same width as the respective ring conductive strip.

15. The elastic multi-contact probe of claim 1, wherein the plurality of dielectric strips comprises a dielectric rubber.

16. The elastic multi-contact probe of claim 1, wherein the layer of thermoplastic comprises a polyoxymethylene (POM).

17. The elastic multi-contact probe of claim 1, wherein the elastic multi-contact probe is attached to a self-aligning applicator.

18. The elastic multi-contact probe of claim 17, wherein the elastic multi-contact probe is configured to be adjusting using the self-aligning applicator.

* * * * *